(12) United States Patent
Patten et al.

(10) Patent No.: US 10,117,028 B2
(45) Date of Patent: Oct. 30, 2018

(54) STRESS DECOUPLING IN MEMS TRANSDUCERS

(71) Applicant: Cirrus Logic International Semiconductor Ltd., Edinburgh (GB)

(72) Inventors: David Talmage Patten, Austin, TX (US); Tsjerk Hans Hoekstra, Balerno (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/417,507

(22) Filed: Jan. 27, 2017

(65) Prior Publication Data

US 2017/0223466 A1   Aug. 3, 2017

Related U.S. Application Data

(60) Provisional application No. 62/288,662, filed on Jan. 29, 2016.

(30) Foreign Application Priority Data

Apr. 1, 2016   (GB) .................... 1605565.9

(51) Int. Cl.
    *H04R 19/04*   (2006.01)
    *H04R 1/04*   (2006.01)
    (Continued)

(52) U.S. Cl.
    CPC ........... *H04R 19/04* (2013.01); *B81B 3/0021* (2013.01); *B81B 7/0048* (2013.01); *H04R 1/04* (2013.01);
    (Continued)

(58) Field of Classification Search
    CPC .... H04R 1/021; H04R 19/005; H04R 19/013; H04R 19/016; H04R 19/02; H04R 19/04; H04R 1/04; B81B 3/0031; B81B 3/0021; B81B 2201/0257

USPC ....... 381/113, 116, 173, 174, 175, 355, 369, 381/190, 191; 257/416; 438/51, 53; 367/170, 181
See application file for complete search history.

(56) References Cited

U.S. PATENT DOCUMENTS

| | | | |
|---|---|---|---|
| 5,938,452 A | | 8/1999 | Wojnarowski |
| 6,178,249 B1 * | | 1/2001 | Hietanen ............... H04R 19/005 367/181 |

(Continued)

FOREIGN PATENT DOCUMENTS

WO   2016/102923 A1   6/2016

OTHER PUBLICATIONS

Combined Search and Examination Report under Sections 17 and 18(3), Application No. GB1605565.9, dated Oct. 14, 2016.

(Continued)

*Primary Examiner* — Huyen D Le
(74) *Attorney, Agent, or Firm* — Jackson Walker L.L.P.

(57) ABSTRACT

A MEMS transducer (200) comprises a substrate (101) having a first surface (102) and a membrane (103) formed relative to an aperture in the substrate. The MEMS transducer (200) further comprises one or more bonding structures (107) coupled to the substrate, wherein the one or more bonding structures (107), during use, mechanically couple the MEMS transducer to an associated substrate (111). The MEMS transducer (200) comprises a sealing element (109) for providing a seal, during use, in relation to the substrate (101) and the associated substrate (111). A stress decoupling member (119) is coupled between the substrate (101) and the sealing element (109).

20 Claims, 11 Drawing Sheets

(51) Int. Cl.
*B81B 3/00* (2006.01)
*H04R 19/00* (2006.01)
*B81B 7/00* (2006.01)

(52) U.S. Cl.
CPC .... *H04R 19/005* (2013.01); *B81B 2201/0257* (2013.01); *B81B 2203/0118* (2013.01); *B81B 2203/0127* (2013.01); *B81B 2207/09* (2013.01); *H04R 2201/003* (2013.01)

(56) References Cited

U.S. PATENT DOCUMENTS

| | | | |
|---|---|---|---|
| 6,522,762 B1 * | 2/2003 | Mullenborn | H04R 19/005 367/181 |
| 8,155,355 B2 * | 4/2012 | Ogura | B81B 7/0061 381/174 |
| 2002/0179921 A1 | 12/2002 | Cohn | |
| 2012/0280335 A1 | 11/2012 | Zoellin et al. | |
| 2016/0050475 A1 | 2/2016 | Khenkin et al. | |

OTHER PUBLICATIONS

International Search Report and Written Opinion of the International Searching Authority, Application No. PCT/GB2017/050185, dated Mar. 27, 2017.

Combined Search and Examination Report under Sections 17 and 18(3), Application No. GB1605565.9, dated Apr. 11, 2017.

* cited by examiner

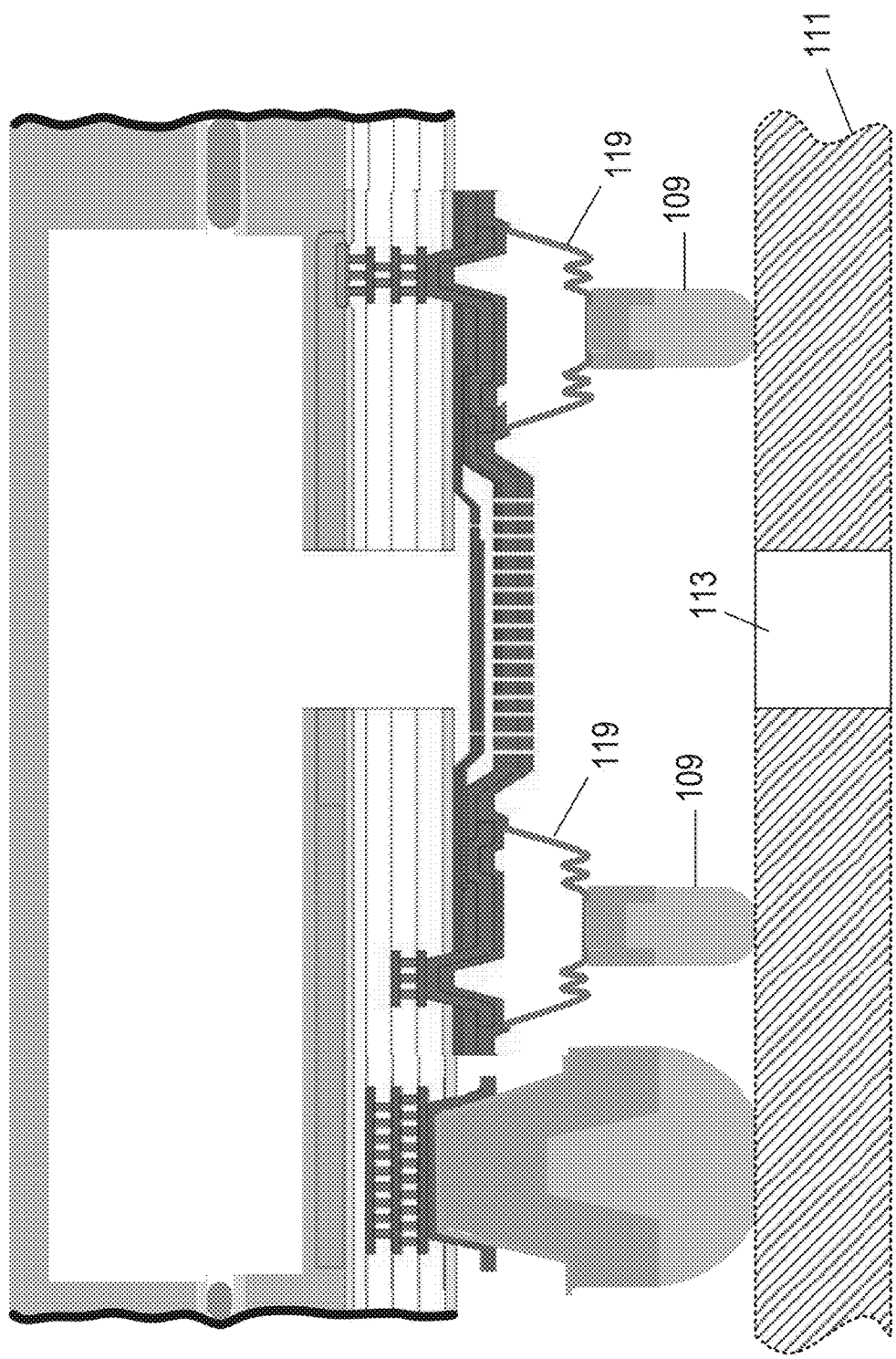

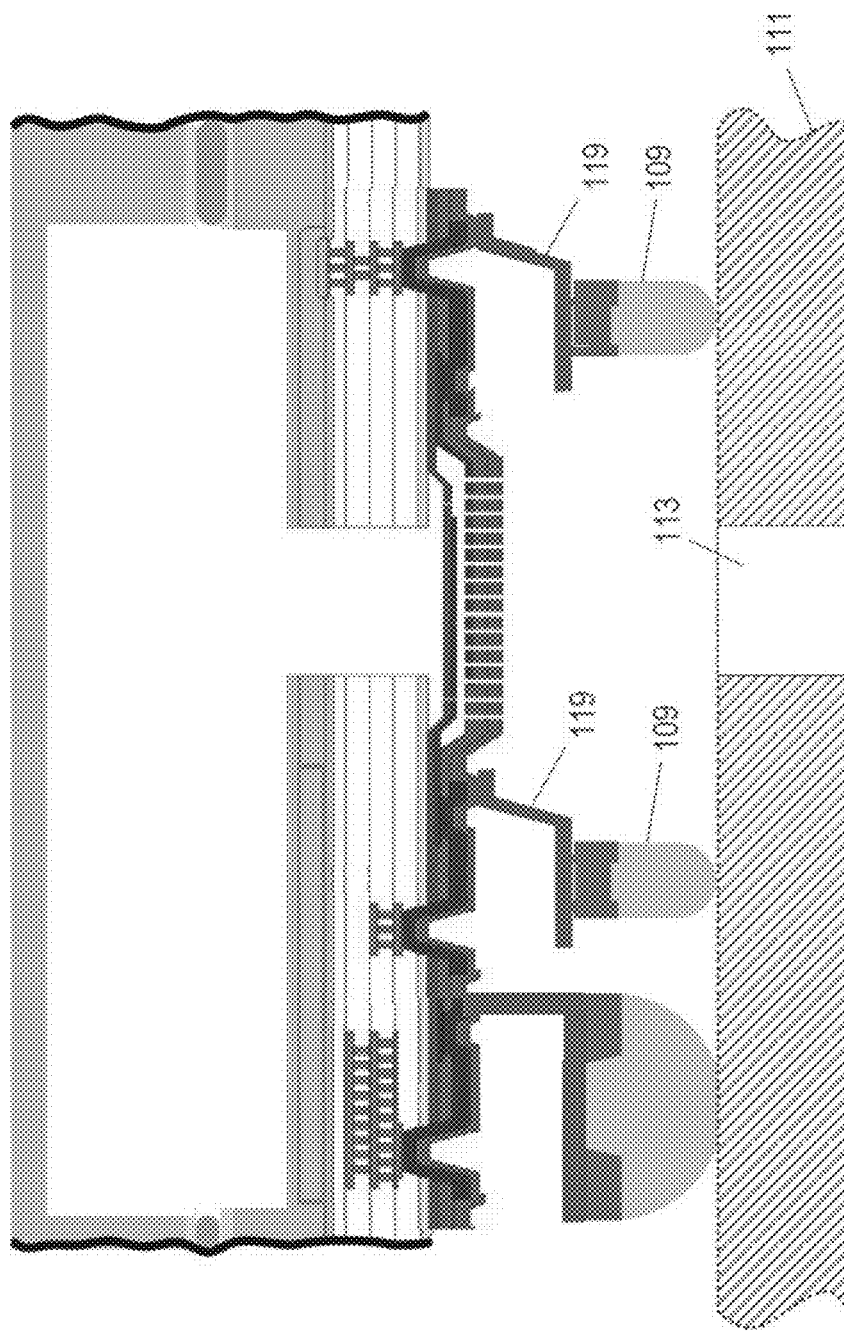

STRESS DECOUPLING IN MEMS TRANSDUCERS

This application claims priority to U.S. Provisional Application No. 62/288,662 filed on Jan. 29, 2016, and British Patent Application No. 1605565.9 filed on Apr. 1, 2016, both of which are incorporated by reference herein in their entirety.

This application relates to methods and apparatus relating to stress decoupling in MEMS transducers and, in particular, to methods and apparatus for providing stress decoupling in connection with a sealing element of a MEMS transducer.

BACKGROUND

Consumer electronics devices are continually getting smaller and, with advances in technology, are gaining ever-increasing performance and functionality. This is clearly evident in the technology used in consumer electronic products and especially, but not exclusively, portable products such as mobile phones, audio players, video players, PDAs, wearable devices, mobile computing platforms such as laptop computers or tablets and/or games devices, or devices operable in an Internet-of-Things (IoT) environment. Requirements of the mobile phone industry for example, are driving the components to become smaller with higher functionality and reduced cost. It is therefore desirable to integrate functions of electronic circuits together and combine them with transducer devices such as microphones and speakers.

Micro-electromechanical-system (MEMS) transducers, such as MEMS microphones are finding application in many of these devices. There is therefore also a continual drive to reduce the size and cost of MEMS devices.

Microphone devices formed using MEMS fabrication processes typically comprise one or more membranes with electrodes for read-out/drive deposited on the membranes and/or a substrate. In the case of MEMS pressure sensors and microphones, the read out is usually accomplished by measuring the capacitance between the electrodes. In the case of output transducers, the membrane is moved by electrostatic forces generated by varying a potential difference applied across the electrodes.

To provide protection the MEMS transducer will typically be contained within, or may itself form a package. The package effectively encloses the MEMS transducer and can provide environmental protection and may also provide shielding for electromagnetic interference (EMI) or the like.

FIG. 1 illustrates an example of a MEMS microphone package 100, and in particular a chip scale (CS) MEMS transducer package, also known as a wafer level package (WLP). A MEMS transducer 103, for example a flexible membrane, is attached to a first surface of a package substrate 101. The MEMS transducer 103 may typically be formed on a semiconductor die by known MEMS fabrication techniques. The package substrate 101 may be silicon or PCB or any other suitable material. A cover 105 is mechanically attached to a second surface of the package substrate 101 (and possibly electrically connected).

The type of packaging arrangement shown in FIG. 1 may be referred to as a "bottom port" configuration, wherein the MEMS transducer package 100 is "flip-chip" bonded to the next level of interconnect, for example to a host substrate 111 (e.g. PCB) within a product device. In such a mounting arrangement the host substrate 111 may comprise a sound port 113 to allow passage of acoustic signals to/from the MEMS transducer 103. The sound port 113 may be arranged to substantially line up with the MEMS transducer 103. The sound port 113 acoustically couples to a first volume on one side of the MEMS transducer 103, which may sometimes be referred to as a front volume. It is noted that other bottom-port arrangements may comprise alternative paths for channeling acoustic signals to/from the MEMS transducer 103, in place of the sound port 113.

The package substrate 101 comprises a first cavity 115, with the cover or cap 105 of this example also comprising a second cavity 117. The first and second cavities 115/117 form what is referred to as a back volume. The back volume may be filled with air (or some other fluid or gas), and is sized sufficiently so that the MEMS transducer 103, e.g. flexible membrane, provides the desired acoustic response.

The back volume 115/117 is generally required to allow the membrane to move freely in response to incident sound or pressure waves, and this back volume may be substantially sealed (although it will be appreciated by one skilled in the art that for MEMS microphones and the like the first and second volumes may be connected by one or more flow paths, such as small holes in the membrane, that are configured so as present a relatively high acoustic impedance at the desired acoustic frequencies but which allow for low-frequency pressure equalisation between the two volumes to account for pressure differentials, for example due to temperature changes. It is noted that in some applications, such as bidirectional microphones, a sound port 104 may also be acoustically coupled to the back volume 115/117, such that the MEMS transducer 103 receives acoustic signals via both the front volume and the back volume.

Although not shown, the package substrate 101 may comprise integrated electronic circuitry, for example integrated electronic circuitry provided for operation of the transducer, which may for example be a low-noise amplifier for amplifying the signal from a MEMS microphone. Such integrated electronic circuitry is electrically connected to electrodes of the transducer 103 and is also attached to the first surface of the package substrate 101, for example to one or more bonding structures 107, which are provided for mechanical and/or electrical connection to another device, e.g. an associated host substrate 111 of a consumer product in which the MEMS package is being used.

The MEMS package 100 may further comprise a sealing element 109 coupled to the first surface of the package substrate 101, the sealing element 109 surrounding the MEMS transducer 103. In one example the sealing element 109 comprises an acoustic sealing element, such as an acoustic sealing ring. Other shaped sealing elements may also be used. The sealing element 109 is provided for acoustically sealing the MEMS transducer 103, for example such that the MEMS transducer 103 only receives acoustic signals being channeled to/from the MEMS transducer 103 in a bottom-port configuration via the sound port 113.

Thus, the sealing element 109, which may be a metalized ring, i.e. a metalized annular bonding structure, is provided to aid in forming an acoustic channel in an assembled host device.

The package substrate 101 and associated substrate 111 to which the MEMS transducer package is affixed in an assembled host device may have different thermal expansion characteristics. As a consequence, changes in temperature can lead to the package substrate 101 expanding at a different rate to the associated substrate 111, and since the package substrate 101 and associated substrate 111 are mechanically fixed by one or more bonding structures 107, this can result in an acoustic seal formed by the sealing element 109 being broken.

SUMMARY

It is an aim of the present invention to provide a method and apparatus which obviate or reduce at least one or more of the disadvantages mentioned above.

According to a first aspect of the present invention there is provided a MEMS transducer comprising a substrate having a first surface, and a membrane formed relative to a cavity in the substrate. The MEMS transducer comprises one or more bonding structures coupled to the substrate, wherein the one or more bonding structures, during use, mechanically couple the MEMS transducer to an associated substrate. The MEMS transducer comprises a sealing element for providing a seal, during use, in relation to the substrate and the associated substrate. A stress decoupling member is coupled between the substrate and the sealing element, for allowing movement of the sealing element relative to the substrate.

According to another aspect of the present invention there is provided a method of fabricating a MEMS transducer. The method comprises forming a substrate having a first surface, and forming a membrane relative to a cavity in the substrate. The method comprises forming one or more bonding structures on the substrate, wherein the one or more bonding structures, during use, mechanically couple the MEMS transducer to an associated substrate. The method comprises forming a sealing element for providing a seal, during use, in relation to the substrate and the associated substrate. The method comprises forming a stress decoupling member between the substrate and the sealing element.

According to another aspect, there is provided a MEMS transducer comprising a substrate, and a membrane formed relative to a cavity in the substrate. One or more bonding structures are coupled to the substrate, wherein the one or more bonding structures, during use, mechanically couple the MEMS transducer to an associated substrate. A stress decoupling member is coupled between the substrate and at least one bonding structure, for allowing movement of the bonding structure relative to the substrate.

According to another aspect, there is provided a MEMS transducer comprising a substrate, and one or more bonding structures coupled to the substrate, wherein the one or more bonding structures, during use, mechanically couple the MEMS transducer to an associated substrate. A stress decoupling member is coupled between the substrate and at least one bonding structure, for allowing movement of the bonding structure relative to the substrate.

BRIEF DESCRIPTION OF THE DRAWINGS

For a better understanding of examples of the present invention, and to show more clearly how the examples may be carried into effect, reference will now be made, by way of example only, to the following drawings in which:

FIG. 3b shows an example of MEMS transducer comprising stress decoupling members according to the embodiment of FIG. 3a;

FIG. 4b shows an example of MEMS transducer comprising stress decoupling members according to the embodiment of FIG. 4a;

FIGS. 5a to 5e shows an example of a method of forming a stress decoupling member according to the embodiment of FIG. 3a;

DESCRIPTION

Embodiments of the present invention relate to a MEMS transducer device, for example a microphone. In some examples the MEMS transducer device forms part of a MEMS transducer package, and may relate to a chip scale (CS) MEMS capacitive microphone package that is formed at wafer-level. In some examples the wafer level package (WLP) comprises a substrate, for example a silicon substrate, which incorporates both the MEMS capacitive microphone and its associated integrated electronic circuitry, for example electronic circuitry for providing drive & read-out circuitry; and a package cover or cap, for example a silicon cap, for protecting the silicon substrate and providing a back-volume for the microphone.

Some of the embodiments will be described below in the form of a MEMS transducer or wafer level package that is configured as a "bottom port" transducer or package, wherein the transducer or package is "flip-chip" bonded to the next level of interconnect, e.g. bonded to an associated host substrate, for example a PCB within a consumer product. It is noted, however, that the invention may also be used in other packaging arrangements, or in other mounting configurations.

It is noted that any dimensions in the Figures of the embodiments described below are conceptual, and not necessarily to scale.

Figure 1:
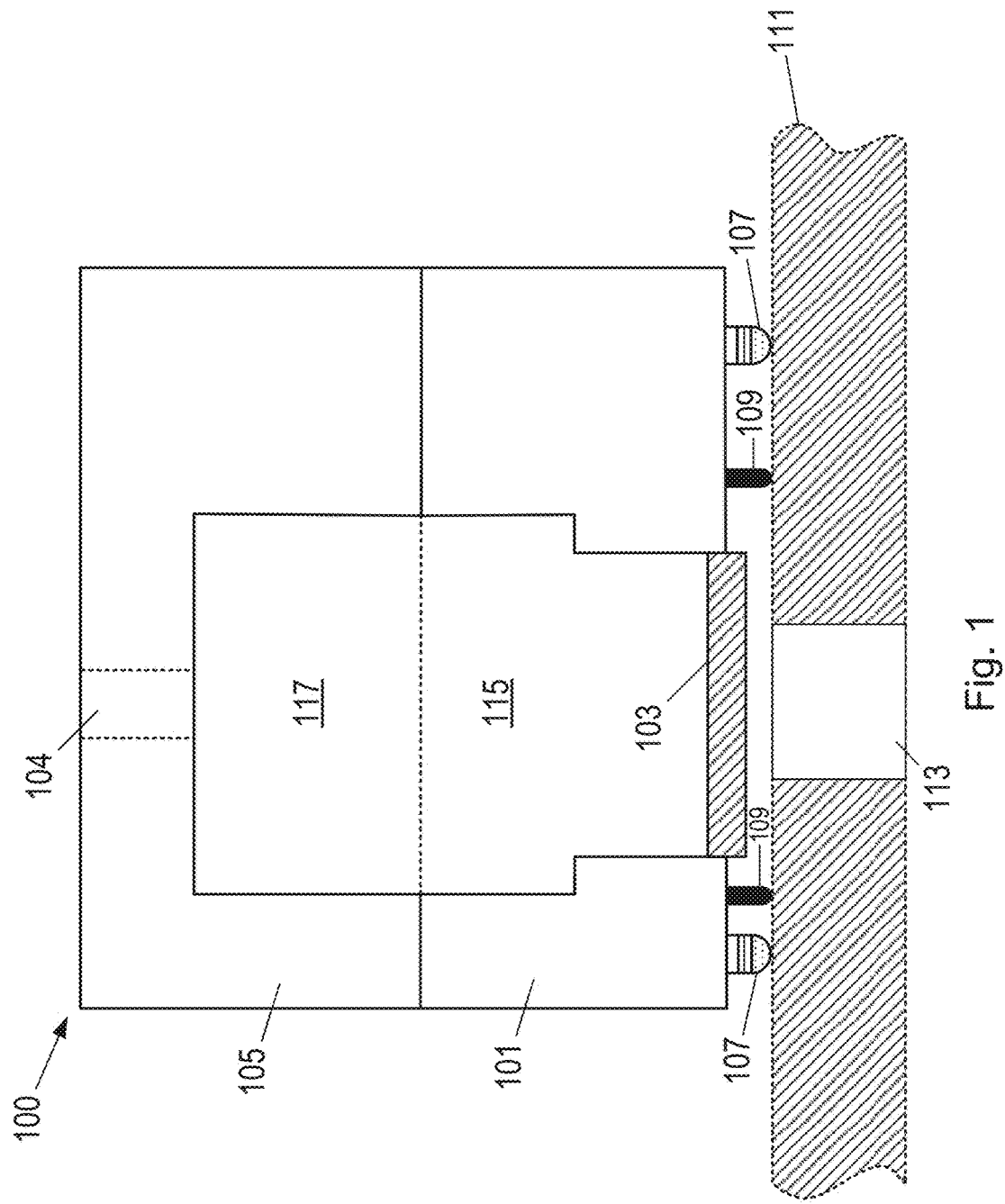
FIG. 1 illustrates a prior art MEMS transducer package.
Figure 2:
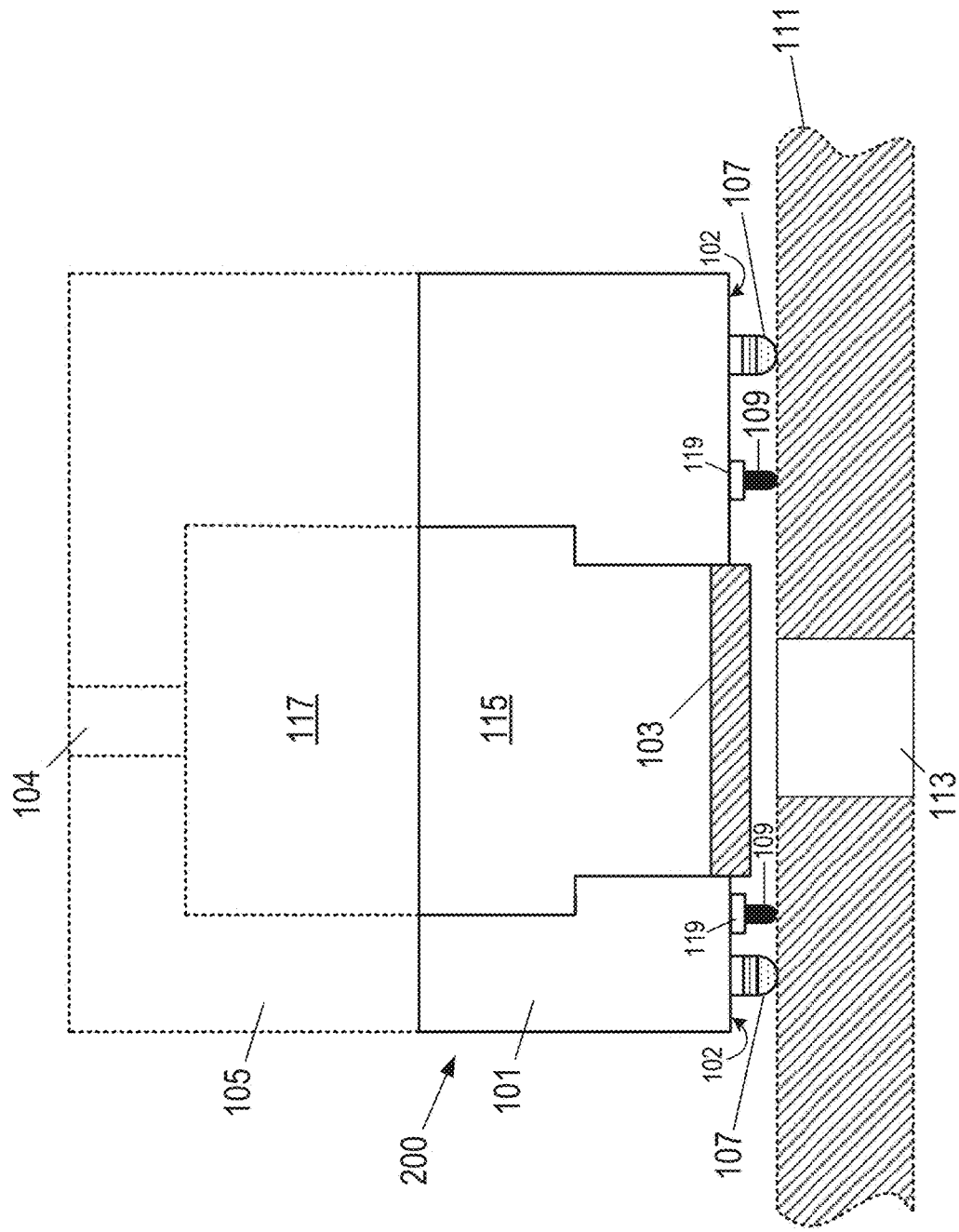
FIG. 2 shows an example of a MEMS transducer according to an embodiment of the present invention.

FIG. 2 shows an example of a MEMS transducer 200 according to an embodiment of the present invention, whereby FIG. 2 relates to a cross-sectional side view of the MEMS transducer (although it is noted that cross-hatching has not been applied to all parts of the transducer in order to assist with the clarity of the drawing).

The MEMS transducer 200 comprises a substrate 101 having a first surface 102. A membrane 103 formed relative to a cavity 115 in the substrate. One or more bonding structures 107 are coupled to the substrate. The one or more bonding structures 107, during use, mechanically couple the MEMS transducer 100 to an associated substrate 111, for example a PCB onto which the MEMS transducer is to be affixed during use, when assembled in a host device. It is noted that the one or more bonding structures 107 may also act as electrical connections, for example for interfacing electrical signals between the MEMS transducer 200 and electrical circuitry on the associated substrate 111.

The MEMS transducer 200 comprises a sealing element 109, for example an acoustic sealing element, for providing a seal, during use, in relation to the substrate 101 and the associated substrate 111. It is noted that although the embodiments described herein refer to the sealing element being an acoustic sealing element for sealing acoustic signals, it is noted that the sealing element may be provided for other forms of sealing, for example sealing the MEMS transducer from light or other environment factors. It is noted that the sealing element 109 does not necessarily provide a hermetic seal when acting as an acoustic element, i.e. the sealing element may comprise one or more openings or perforations, provided it still acts as an acoustic seal or barrier for preventing or suppressing the passage of acoustic signals. In a bottom-port arrangement as shown in FIG. 2, the sealing element 109 can provide an acoustic seal around the membrane 103, such that acoustic waves incident on the membrane 103 are restricted to the acoustic waves that pass through a sound port 113 in the associated substrate 111, i.e. such that no unwanted sound waves are received by the membrane 103, e.g. from the side passages between the substrate 101 and associated substrate 111.

A stress decoupling member 119 is coupled between the substrate 101 and the sealing element 109, for allowing movement of the sealing element 109 relative to the substrate 101.

The stress decoupling member 119 provides the advantage that, should the substrate 101 and the associated substrate 111 (e.g. a PCB to which the MEMS transducer is mechanically attached during use via the one or more bonding structures) thermally expand at different rates, e.g. due to the substrate 101 and associated substrate 111 having different thermal expansion coefficients, or move relative to one another, then the stress decoupling member 119 can allow movement of the acoustic sealing element 119 relative to the substrate, to maintain the required acoustic seal. This provides a form of stress decoupling within the MEMS transducer 200, and in particular to the acoustic sealing element 109 from movements of the substrate 101 and associated substrate 111 which are mechanically fixed.

In one embodiment the stress decoupling member 119 is configured to allow movement of the sealing element 109 (e.g. acoustic sealing element) in a lateral direction and/or an orthogonal direction and/or a diagonal direction with respect to the first surface 102 of the substrate.

Figure 3A:
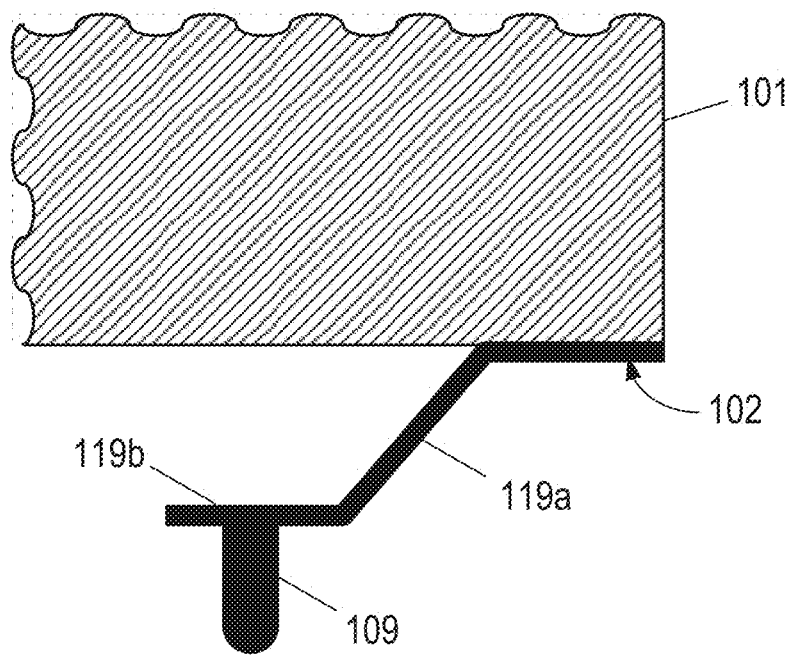
FIG. 3a shows an example of a stress decoupling member according to an embodiment of the present invention.

FIG. 3a shows an example of one embodiment of a stress decoupling member 119. According to this embodiment the stress decoupling member 119 comprises a cantilever, or leaf spring, type arrangement.

For example, the stress decoupling member 119 may comprise a first arm 119a having a first end coupled to the first surface 102 of the substrate, wherein the first arm 119a extends from the first surface 102. A second arm 119b has a first end coupled to a second end of the first arm 119a, wherein a second end of the second arm 119b is free to move. The sealing element 109 is coupled between the first and second ends of the second arm 119b.

This arrangement has the advantage of allowing the sealing element 109 to move, for example in response to respective movement of an associated substrate to which the sealing element 109 is affixed during use, in relation to the substrate 101 to which the sealing element 109 is also coupled (via the stress decoupling member 119).

In this example the first arm 119a extends at an angle from the first surface 102 of the substrate 101. It is noted, however, that the first arm could extend substantially orthogonal to the first surface 102.

In this example the second arm 119b extends, for example during non-stressed conditions, from the second end of the first arm 119a in a plane that is substantially parallel to the plane of the first surface 102.

In some examples the first and second arms 119a, 119b are integrally formed as part of the first surface 102 of the substrate 101, or part of another layer formed on the first surface 102. For example, in one embodiment the first and second arms 119a, 119b are integrally formed as part of a membrane layer forming at least part of the first surface 102 of the substrate 101. In other words, when forming another layer or structure on another part of the substrate 101, such as forming a membrane 103, the stress decoupling member 119 may be formed as part of such a process. In such an example the stress decoupling member 119 may be formed from the same material as the membrane.

It is noted that the stress decoupling member 119 of FIG. 3a may comprise other shapes, for example a continuous curved structure comprising the first and second arms, e.g. an "S-shaped" structure. The stress decoupling member 119 of FIG. 3a may also comprise further arms or curves. It is noted that various parameters may be controlled to change the stress decoupling characteristics of the stress decoupling member 119, for example any one or more of the size, width, height, thickness, or material of the stress decoupling member 119 itself.

Figure 3B:
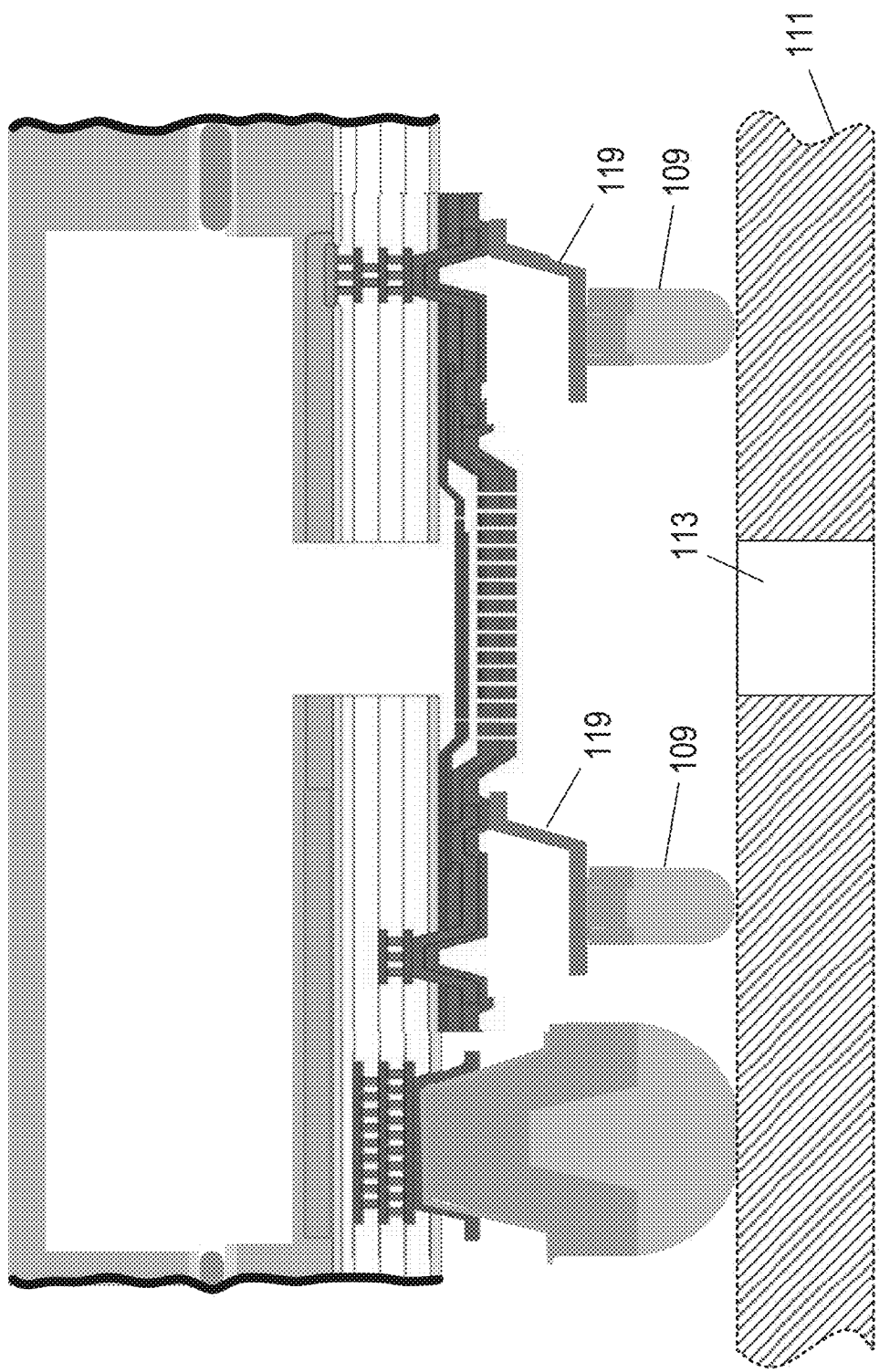

FIG. 3b shows an example of a portion of a MEMS transducer package, comprising a MEMS transducer and cover, wherein stress decoupling members 119 are provided between a substrate of the MEMS transducer and acoustic sealing elements 109, the stress decoupling members 119 being of the type shown in the embodiment of FIG. 3a.

Figure 4A:
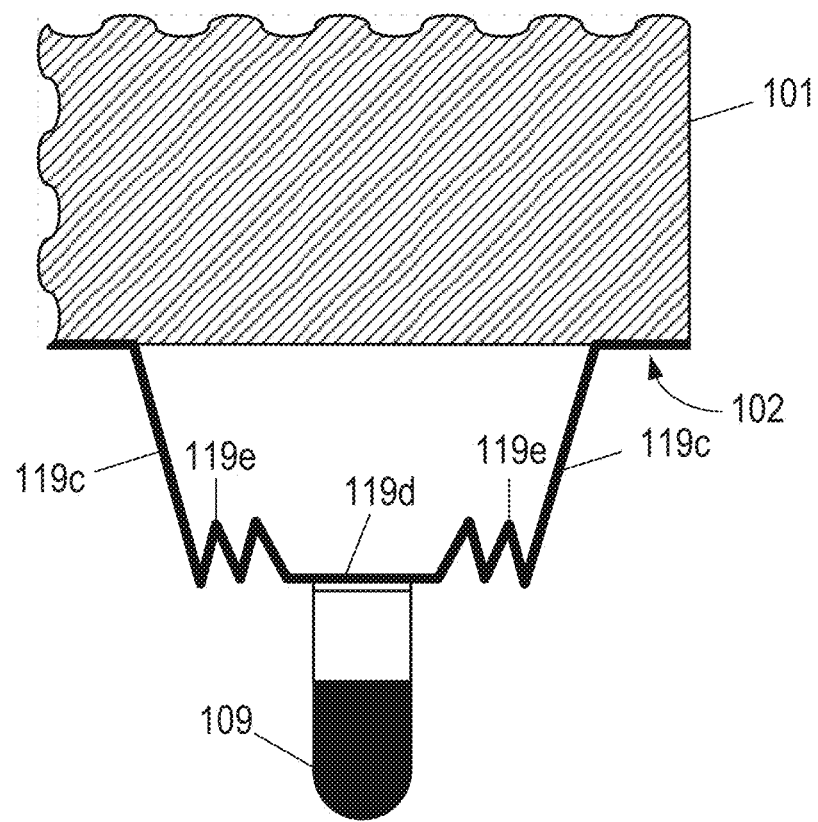
FIG. 4a shows an example of a stress decoupling member according to another embodiment of the present invention.

FIG. 4a shows an example according to another embodiment of a stress decoupling member 119. The stress decoupling member 119 comprises a raised section extending from the first surface 102 of the substrate 101.

In one example the raised section comprises a sidewall section 119c extending from the first surface of the substrate 101. A support section 119d receives the sealing element 119, e.g. acoustic sealing element. A resilient section 119e is coupled between the sidewall section 119c and the support section 119d, wherein the resilient section 119e is configured to allow movement of the support section 119d relative to the sidewall section 119c.

In one example, the resilient section 119e is configured to allow movement of the support section 119d in a lateral direction and/or an orthogonal direction and/or a diagonal direction with respect to the first surface 102 of the substrate 101. In some examples, it is noted that the sidewall 119c may also contribute to any movement in the lateral direction and/or an orthogonal direction and/or a diagonal direction with respect to the first surface 102 of the substrate 101.

The resilient section 119e may comprise a corrugated or spring type arrangement.

In the example of FIG. 4a the support section 119d lies, for example during non-stressed conditions, in a plane substantially parallel to a plane of the first surface 102 of the substrate 101. The sidewall section 119c extends at an angle from the first surface 102 of the substrate 101, although it is noted that the sidewall section 119c may also extend substantially orthogonal to the first surface 102.

In some examples the sidewall section 119c, support section 119d and resilient section 119e are integrally formed as part of the first surface 102 of the substrate 101, or another layer formed on the first surface 102.

For example, the sidewall section 119c, support section 119d and resilient section 119e may be integrally formed as part of a membrane layer forming at least part of the first surface 102 of the substrate 101. In other words, when forming another layer of the package substrate, the stress decoupling member can be formed during the same etching process, and from the same material as that other layer.

The sealing element 119 may comprise an acoustic sealing element that is configured such that it completely surrounds a membrane. For example the acoustic sealing element 119 may comprise an annular or cylindrical structure, or ring, for surrounding a membrane. The acoustic sealing element 119 may be formed, for example, from a metalized or silicon layer. As mentioned earlier, the acoustic element need not necessarily provide a hermetic seal, provided it provides an acoustic barrier. As such, one or more openings may be provided in the annular structure. In each of the embodiments described herein, it is noted that a sealing element 109 may itself comprise multiple components or materials, for example formed from one or more of a plurality of different materials (e.g. silicon, semiconductor, PCB, ceramic, laminate, plastic, metal, nickel, gold, silver), and may include a solder section for affixing the sealing element 109 to another substrate.

FIG. 4b shows an example of part of a MEMS transducer package, comprising a MEMS transducer and cover, wherein stress decoupling members 119 are provided between a substrate of the MEMS transducer and acoustic sealing elements 109, the stress decoupling members 119 being the type shown in the embodiment of FIG. 4a.

Although not shown in the examples of FIGS. 2 to 4, it is noted that the substrate 101 may comprise integrated electronic circuitry. For example, the integrated electronic circuitry may comprise analogue circuitry and/or digital circuitry.

It is also noted that, although the embodiments described above shows one membrane formed in relation to one cavity or aperture in the MEMS transducer, the MEMS transducer may comprise multiple individual membranes formed relative to one or more openings in the substrate. At least one of said multiple individual membranes may be a different type of transducer to at least one other of said multiple individual membranes, for example where different individual membranes are designed to have different characteristics for a particular application.

The MEMS transducers described herein may comprises a cover, wherein the MEMS transducer and cover form a MEMS transducer package.

In the embodiments described above the MEMS transducer may comprise a MEMS microphone.

As mentioned above, although the embodiments described herein refer to the sealing element being an acoustic sealing element for sealing acoustic signals, it is noted that the sealing element may be provided for other forms of sealing, for example sealing the MEMS transducer from light or other environment factors.

According to another embodiment, there is provided an electronic device comprising a MEMS transducer as described herein. The electronic apparatus may comprise, for example, a portable device; a wearable device, a battery power device; a computing device; a communications device; a device adapted for use in an Internet-of-Things (IoT) system, a gaming device; a mobile telephone; a personal media player; a laptop, tablet or notebook computing device.

According to another aspect of the invention, there is provided a method of fabricating a MEMS transducer 200.

In one embodiment the method comprises: forming a substrate 101 having a first surface 102; forming a membrane 103 relative to an aperture in the substrate; forming one or more bonding structures 107 on the substrate, wherein the one or more bonding structures 107, during use, mechanically couple the MEMS transducer 100 to an associated substrate 111; forming a sealing element 109 for providing a seal, during use, in relation to the substrate 101 and the associated substrate 111; and forming a stress decoupling member 119 between the substrate 101 and the sealing element 109, for allowing movement of the sealing element 109 relative to the substrate 101.

The method may comprise the steps of forming the stress decoupling member 119 such that it allows movement of the sealing element 119 in a lateral direction and/or an orthogonal direction and/or diagonal direction with respect to the first surface 102 of the substrate 101.

The step of forming the stress decoupling member 119 comprises forming a cantilever, or leaf spring, type arrangement.

In some embodiments the step of forming the stress decoupling member 119 comprises the steps of: depositing a sacrificial layer such that the sacrificial layer comprises the desired shape of the stress decoupling member; forming the stress decoupling member over the sacrificial layer; and removing the sacrificial layer to allow movement of the stress decoupling member 119.

FIGS. 5a to 5e illustrate such a method for forming a stress decoupling member according to the embodiment of FIG. 3a.

Figure 5A:
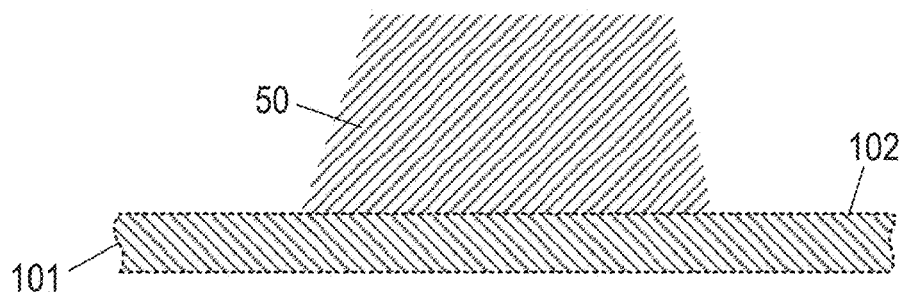

FIG. 5a shows the step of depositing a sacrificial layer 50 such that the sacrificial layer comprises the desired shape of the stress decoupling member. The sacrificial layer may be deposited on a first surface 102 of a substrate 101 (or to another layer, not shown, formed on the surface of the substrate 101).

Figure 5B:
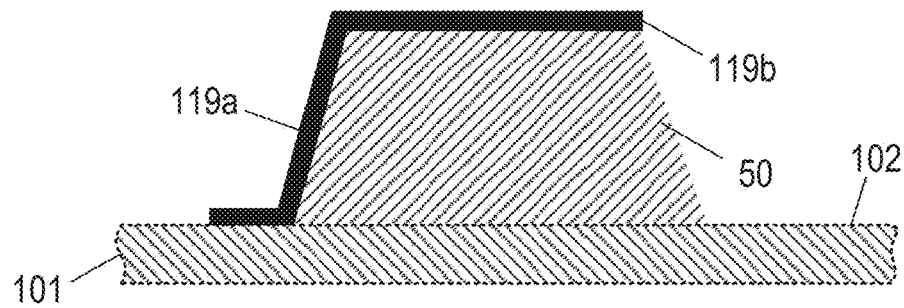

FIG. 5b shows the step of forming the stress decoupling member over the sacrificial layer 50. In this particular example, this results in the method forming a stress decoupling member by forming a first arm 119a having a first end coupled to a first surface 102 of the substrate 101 (or to another layer, not shown, formed on the surface of the substrate 101) wherein the first arm 119a extends from the first surface 102. The method comprises forming a second arm 119b having a first end coupled to a second end of the first arm 119a, wherein a second end of the second arm 119b is free to move (as described below, after removal of the sacrificial layer 50).

Figure 5C:
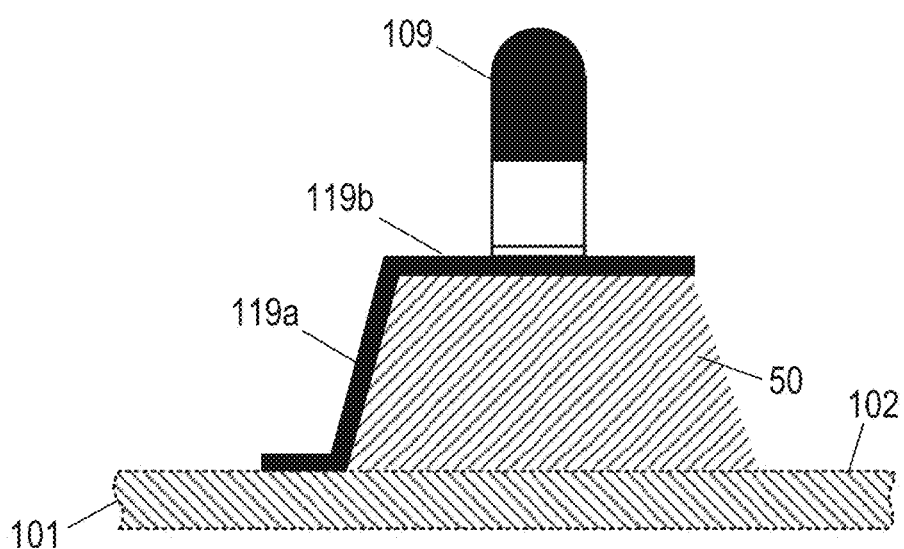

FIG. 5c shows the step of forming the acoustic sealing element 109 between the first and second ends of the second arm 119b. The sealing element 109 may be formed from one or more materials, including for example one or more of silicon, semiconductor, PCB, ceramic, laminate, plastic, nickel, gold, silver, solder.

Figure 5D:
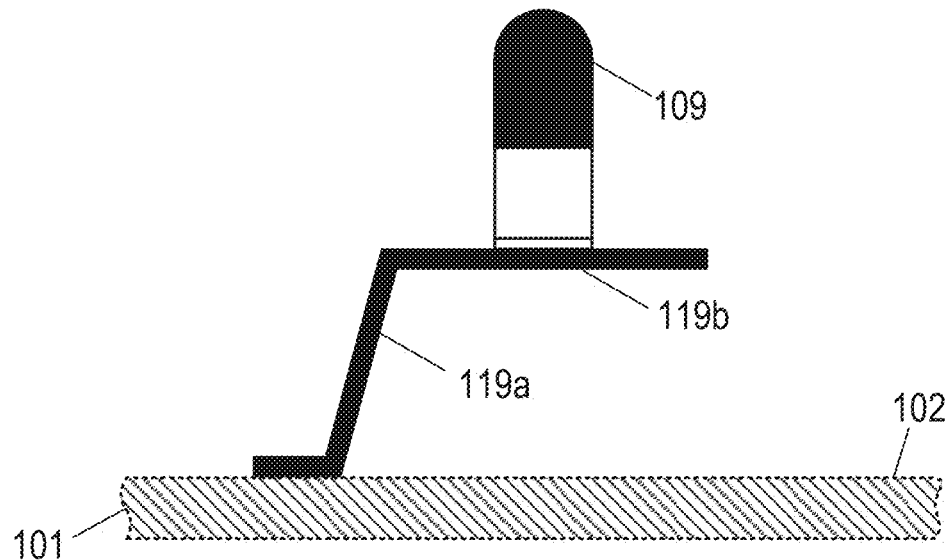
Figure 5E:
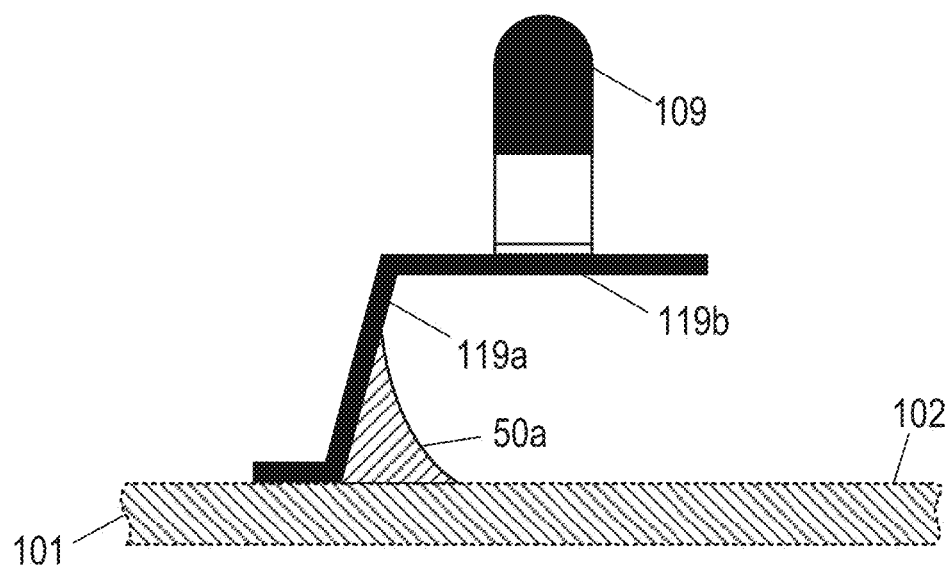

FIG. 5d shows the step of removing the sacrificial layer to allow movement of the stress decoupling member 119.

If desired, the step of removing the sacrificial layer to allow movement of the stress decoupling member 119 may comprise retaining at least a portion 50a of the sacrificial layer, for example to control the stress decoupling characteristics of the stress decoupling member 119. It is noted that other parameters may be controlled to change the stress decoupling characteristics of the stress decoupling member 119, for example any one or more of the size, width, height, thickness, or material of the stress decoupling member 119 itself.

From the above, it can be seen that in this example the method comprises forming the first arm 119a to extend at an angle from the first surface 102 of the substrate 101. The method may comprise forming the second arm 119b to extend from the second end of the first arm 119a in a plane substantially parallel to the plane of the first surface 102 of the substrate 101.

The method steps may be performed as method steps when forming some other part of the MEMS transducer, for example involving integrally forming the first and second arms 119a, 119b as part of the first surface 102 of the substrate 101, or another layer formed on the first surface. For example, the method may comprise integrally forming the first and second arms as part of the steps of forming a membrane layer in at least part of the first surface 102 of the substrate 101.

FIGS. 6a to 6e illustrate an example of a method for forming a stress decoupling member according to the embodiment of FIG. 4a. In this example the method therefore comprises the step of forming the stress decoupling member 119 as a raised section extending from a first surface 102 of a substrate 101.

Figure 6A:
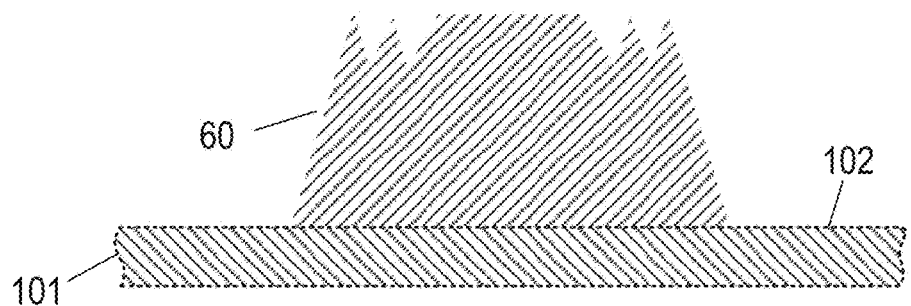
FIGS. 6a to 6e shows an example of a method of forming a stress decoupling member according to the embodiment of FIG. 4a, and FIG. 7 shows a further embodiment.

FIG. 6a shows the step of depositing a sacrificial layer 60 such that the sacrificial layer 60 comprises the desired shape of the stress decoupling member.

Figure 6B:
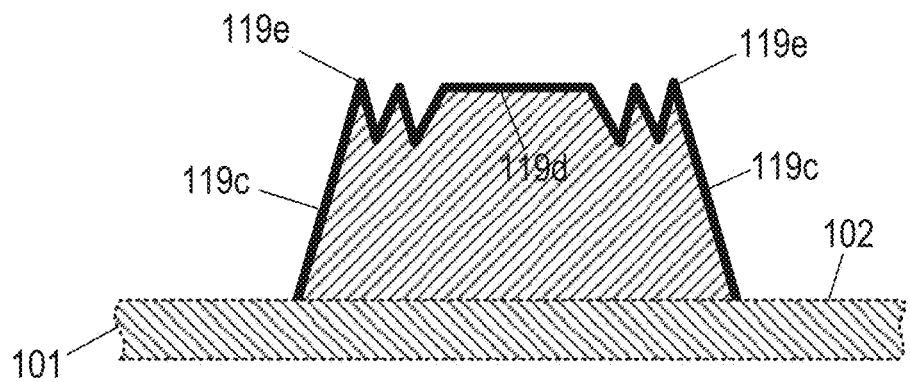

FIG. 6b shows the step of forming the stress decoupling member over the sacrificial layer 60. In this particular example, this results in the method forming a stress decoupling member by forming a sidewall section 119c that extends from the first surface of the substrate (not shown), forming a support section 119d for receiving the sealing element 119, and forming a resilient section 119e between the sidewall section 119c and the support section 119d, wherein the resilient section is formed to allow movement of the support section 119d relative to the sidewall section 119c (as described below, after removal of the sacrificial layer 60).

The method may comprise forming the resilient section 119e to allow movement of the support section 119d in a lateral direction and/or an orthogonal direction and/or diagonal direction with respect to the first surface 102 of the substrate 101.

The step of forming the resilient section 119e may comprises the step of forming a corrugated, or spring, type arrangement.

Figure 6C:
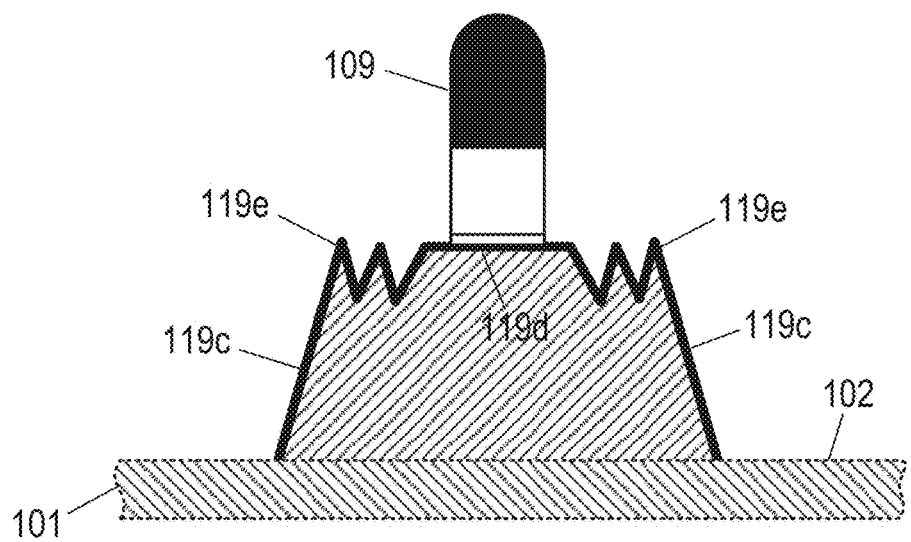

FIG. 6c shows the step of forming the acoustic sealing element 109 on the support section 119d.

Figure 6D:
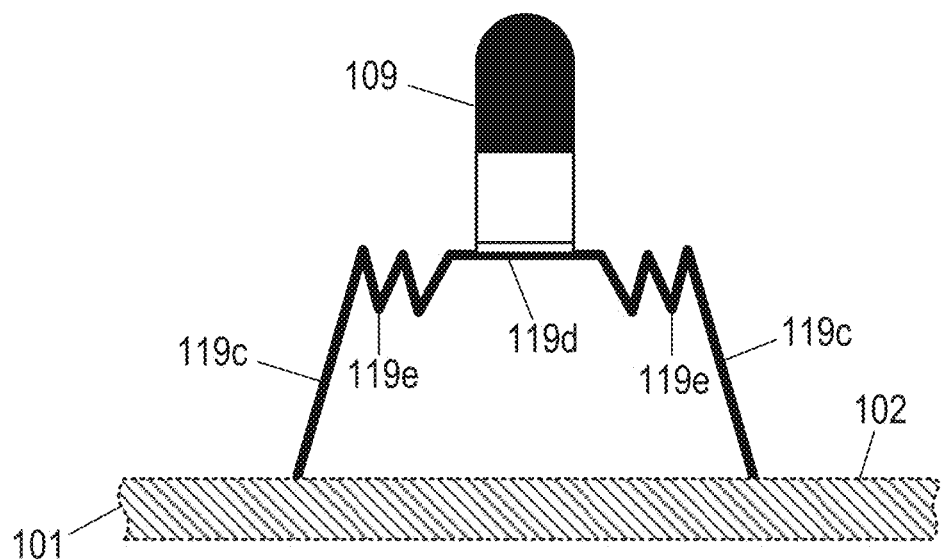
Figure 6E:
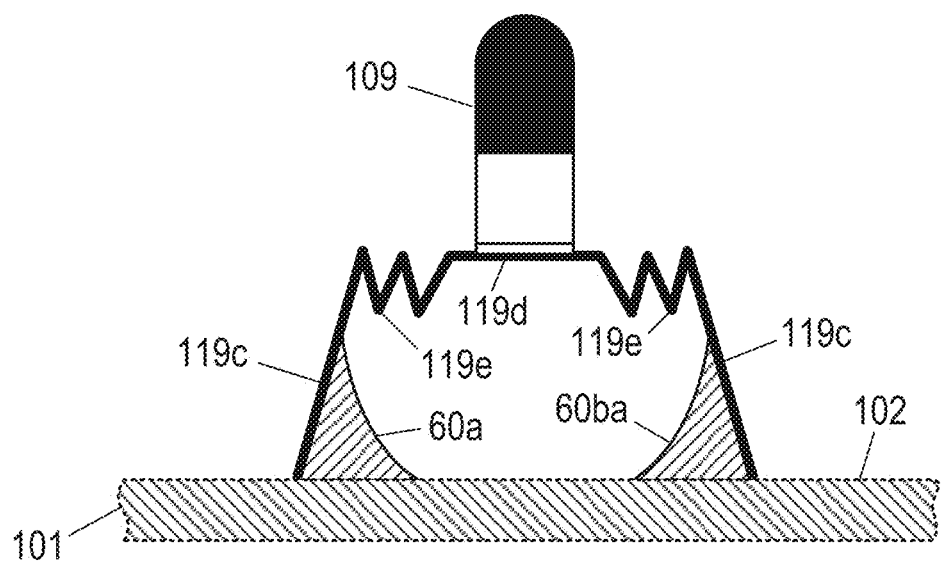

FIG. 6d shows the step of removing the sacrificial layer 60 to allow movement of the stress decoupling member 119.

If desired, the step of removing the sacrificial layer to allow movement of the stress decoupling member 119 may comprise retaining at least a portion, e.g. 60a/60b of the sacrificial layer, for example to control the stress decoupling characteristics of the stress decoupling member 119. It is noted that other parameters may be controlled to change the stress decoupling characteristics of the stress decoupling member 119, for example any one or more of the size, width, height, thickness, or material of the stress decoupling member 119 itself.

From the above, it can be seen that in this example the method comprises forming the support section 119d to lie in a plane substantially parallel to a plane of the first surface 102 of the substrate 101. In this example the method also comprises forming the sidewall section 119c to extend at an angle from the first surface 102 of the substrate 101.

The method steps may be performed as method steps when forming some other part of the MEMS transducer, for example involving integrally forming the sidewall section 119c, resilient section 119e and support section 119d as part of the first surface 102 of the substrate 101, or part of another layer formed on the substrate 101. For example, the method may comprise integrally forming the first and second arms as part of the steps of forming a membrane layer in at least part of the first surface 102 of the substrate 101.

In some examples the method may comprise forming the sealing element, in the form of an acoustic sealing element that surrounds a membrane. Forming the acoustic sealing element may comprise forming an annular or cylindrical structure or ring around the membrane. The step of forming the acoustic sealing element, in some examples, comprises depositing a metal or silicon sealing element. As mentioned above, the sealing element need not necessarily provide a hermetic seal, provided it provides an acoustic barrier.

According to another embodiment there is provided a MEMS transducer 200 comprising a substrate 101 and a membrane 103 formed relative to a cavity 115 in the substrate. The MEMS transducer comprises a sealing element 109, and a stress decoupling member 119 coupling the sealing element 109 to the substrate 101, wherein the stress decoupling member 119 is configured to allow movement of the sealing element 109 relative to the substrate 101.

In such an embodiment the stress decoupling member 119 may be configured according to any of the embodiments described above.

According to another embodiment, in an example where a package cover 105 comprises an aperture or sound port, for example a sound port 104 as shown in FIG. 2, and for example whereby such a MEMS transducer package is bonded to a next level interconnect, via bonding structures coupled to the package cover 105, the stress decoupling members 119 of the present invention may also be used to decouple stress in any sealing element 109 provided around such an aperture 104. According to such an embodiment there is therefore provided a MEMS transducer 200 comprising: a substrate 105 comprising an aperture 104; a sealing element 109 surrounding the aperture (104); and a stress decoupling member 119 coupling the sealing element 109 to the substrate 105, wherein the stress decoupling member 119 is configured to allow movement of the sealing element 109 relative to the substrate 105.

In such an embodiment the stress decoupling member 119 may be configured according to any of the embodiments described above.

The embodiments described above provide the advantage of having stress decoupling between a sealing element and a MEMS transducer, such that a seal can be maintained despite movements in various parts of the MEMS transducer.

In the examples described herein, it is noted that the membrane 103 is not necessarily circular. For example, the membrane 103 may comprise any other shape, including for example a polygon shape or cow-hide shaped device, or a membrane mounted on stress reduction areas.

It is noted that, in the embodiments described herein, although the bonding structures 107 are shown as being configured or arranged in various corners of a MEMS transducer, the bonding structures may instead be configured in a particular region, for example to one side of a membrane. Such an arrangement can provide yet further stress decoupling.

According to another aspect of the invention, stress decoupling members 119 as described above may be used to provide stress decoupling between the substrate of a MEMS transducer and one or more of the bonding structures.

FIG. 7 shows such an example, whereby a stress decoupling member, e.g. similar to that of FIG. 3a (but with a first arm orthogonal to the substrate, rather than a slanted first arm) is coupled between the bonding structure on the left of the Figure and the substrate to which it is coupled. It is noted that any shaped stress decoupling member as described herein may be used with a bonding structure.

Thus, according to one embodiment, there is provided a MEMS transducer, for example as described in any of the embodiments above, which further comprises a stress decoupling member coupled between at least one bonding structure and the substrate, wherein the stress decoupling member is configured to allow movement of the bonding structure relative to the substrate.

In other embodiments, stress decoupling members may be used with bonding structures, regardless of whether any stress decoupling members are provided on a sealing element.

In one example there is provided a MEMS transducer comprising a substrate, and a membrane formed relative to a cavity in the substrate. The MEMS transducer comprises one or more bonding structures coupled to the substrate, wherein the one or more bonding structures, during use, mechanically couple the MEMS transducer to an associated substrate. A stress decoupling member is coupled between the substrate and at least one bonding structure, for allowing movement of the bonding structure relative to the substrate.

In another example, there is provided a MEMS transducer comprising a substrate, and one or more bonding structures coupled to the substrate, wherein the one or more bonding structures, during use, mechanically couple the MEMS transducer to an associated substrate. A stress decoupling member is coupled between the substrate and at least one bonding structure, for allowing movement of the bonding structure relative to the substrate.

In the embodiments and examples described above, it is noted that the MEMS transducer and stress decoupling members may be formed by any suitable processing techniques, for instance by using CMOS compatible MEMS fabrication techniques.

It is noted that, as used in this specification, it should be understood that the terms upper and lower should not be in any way construed as limiting to any particular orientation of the transducer during any fabrication step and/or orientation in any package, or indeed the orientation of the package in any apparatus. The relative terms lower, above, below, underside, underneath etc. shall be construed accordingly.

Embodiments may be implemented in a host device, especially a portable and/or battery powered host device such as a mobile telephone, and audio player, a video player, a PDA, a mobile computing platform such as a laptop computer or tablet and/or a games device for example or in an accessory device, such a headset, earbud (possibly noise-cancelling), or microphone assembly, designed for wired, or wireless connection with such host devices, possibly via multi-wire cables, multi-pole jacks, or optical fibres and connectors.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. A MEMS transducer comprising:
   a substrate having a first surface;
   a membrane formed relative to a cavity in the substrate;
   one or more bonding structures coupled to the substrate, wherein the one or more bonding structures, during use, mechanically couple the MEMS transducer to an associated substrate;
   a sealing element for providing a seal, during use, in relation to the substrate and the associated substrate; and
   a stress decoupling member coupled between the substrate and the sealing element, for allowing movement of the sealing element relative to the substrate, wherein the stress decoupling member comprises:
      a first arm having a first end coupled to the first surface of the substrate, wherein the first arm extends from the first surface; and
      a second arm having a first end coupled to a second end of the first arm, wherein a second end of the second arm is free to move; and
   wherein the sealing element is coupled between the first and second ends of the second arm.

2. A MEMS transducer as claimed in claim 1, wherein the stress decoupling member is configured to allow movement of the sealing element in a lateral direction and/or an orthogonal direction and/or a diagonal direction with respect to the first surface of the substrate.

3. A MEMS transducer as claimed in claim 1, wherein the stress decoupling member comprises a cantilever, or leaf spring, type arrangement.

4. A MEMS transducer as claimed in claim 1, wherein the first arm extends at an angle from the first surface of the substrate.

5. A MEMS transducer as claimed in claim 1, wherein the second arm extends from the second end of the first arm in a plane that is substantially parallel to the plane of the first surface.

6. A MEMS transducer as claimed in claim 1, wherein the first and second arms are integrally formed as part of the first surface of the substrate, or part of another layer formed on the first surface.

7. A MEMS transducer as claimed in claim 6, wherein the first and second arms are integrally formed as part of a membrane layer forming at least part of the first surface of the substrate.

8. A MEMS transducer as claimed in claim 1, wherein the sealing element comprises an acoustic sealing element that surrounds the membrane.

9. A MEMS transducer as claimed in claim 1, wherein the MEMS transducer comprises multiple individual membranes formed relative to one or more openings in the substrate.

10. A MEMS transducer as claimed in claim 1 wherein said MEMS transducer is a MEMS microphone.

11. A MEMS transducer as claimed in claim 1, further comprising:
   a stress decoupling member coupled between at least one bonding structure and the substrate, wherein the stress decoupling member is configured to allow movement of the bonding structure relative to the substrate.

12. A MEMS transducer comprising:
   a substrate having a first surface;
   a membrane formed relative to a cavity in the substrate;
   one or more bonding structures coupled to the substrate, wherein the one or more bonding structures, during use, mechanically couple the MEMS transducer to an associated substrate;
   a sealing element for providing a seal, during use, in relation to the substrate and the associated substrate; and
   a stress decoupling member coupled between the substrate and the sealing element, for allowing movement of the sealing element relative to the substrate, wherein the stress decoupling member comprises a raised section extending from the first surface of the substrate, and wherein the raised section comprises:
      a sidewall section extending from the first surface of the substrate;
      a support section for receiving the sealing element; and a resilient section coupled between the sidewall section and the support section, wherein the resilient section is configured to allow movement of the support section relative to the sidewall section.

13. A MEMS transducer as claimed in claim 12, wherein the resilient section is configured to allow movement of the support section in a lateral direction and/or an orthogonal direction and/or a diagonal direction with respect to the first surface of the substrate.

14. A MEMS transducer as claimed in claim 12, wherein the resilient section comprises a corrugated or spring type arrangement.

15. A MEMS transducer as claimed in claim 12, wherein the support section lies in a plane substantially parallel to a plane of the first surface of the substrate.

16. A MEMS transducer as claimed in claim 12, wherein the sidewall section extends at an angle from the first surface of the substrate.

17. A MEMS transducer comprising:
a substrate;
a membrane formed relative to a cavity in the substrate;
a sealing element; and
a stress decoupling member coupling the sealing element to the substrate, wherein the stress decoupling member is configured to allow movement of the sealing element relative to the substrate, wherein the stress decoupling member comprises:
  a first arm having a first end coupled to the first surface of the substrate, wherein the first arm extends from the first surface; and
  a second arm having a first end coupled to a second end of the first arm, wherein a second end of the second arm is free to move; and
wherein the sealing element is coupled between the first and second ends of the second arm.

18. A MEMS transducer comprising:
a substrate;
a membrane formed relative to a cavity in the substrate;
one or more bonding structures coupled to the substrate, wherein the one or more bonding structures, during use, mechanically couple the MEMS transducer to an associated substrate; and
a stress decoupling member coupled between the substrate and at least one bonding structure, for allowing movement of the bonding structure relative to the substrate, wherein the stress decoupling member comprises:
  a first arm having a first end coupled to the first surface of the substrate, wherein the first arm extends from the first surface; and
  a second arm having a first end coupled to a second end of the first arm, wherein a second end of the second arm is free to move; and
wherein the sealing element is coupled between the first and second ends of the second arm.

19. A MEMS transducer comprising:
a substrate;
a membrane formed relative to a cavity in the substrate;
a sealing element; and
a stress decoupling member coupling the sealing element to the substrate, wherein the stress decoupling member is configured to allow movement of the sealing element relative to the substrate wherein the stress decoupling member comprises a raised section extending from the first surface of the substrate, and wherein the raised section comprises:
  a sidewall section extending from the first surface of the substrate;
  a support section for receiving the sealing element; and
  a resilient section coupled between the sidewall section and the support section, wherein the resilient section is configured to allow movement of the support section relative to the sidewall section.

20. A MEMS transducer comprising:
a substrate;
a membrane formed relative to a cavity in the substrate;
one or more bonding structures coupled to the substrate, wherein the one or more bonding structures, during use, mechanically couple the MEMS transducer to an associated substrate; and
a stress decoupling member coupled between the substrate and at least one bonding structure, for allowing movement of the bonding structure relative to the substrate, wherein the stress decoupling member is configured to allow movement of the sealing element relative to the substrate wherein the stress decoupling member comprises a raised section extending from the first surface of the substrate, and wherein the raised section comprises:
  a sidewall section extending from the first surface of the substrate;
  a support section for receiving the sealing element; and
  a resilient section coupled between the sidewall section and the support section, wherein the resilient section is configured to allow movement of the support section relative to the sidewall section.

* * * * *